(12) United States Patent
Cho et al.

(10) Patent No.: US 7,871,939 B2
(45) Date of Patent: Jan. 18, 2011

(54) METHOD FOR MANUFACTURING SEMICONDUCTOR DEVICE USING A FREE RADICAL ASSISTED CHEMICAL VAPOR DEPOSITION NITRIFYING PROCESS

(75) Inventors: Gyu Dong Cho, Seoul (KR); Ho Jin Cho, Gyeonggi-do (KR); Hyun Jung Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 607 days.

(21) Appl. No.: 11/966,185

(22) Filed: Dec. 28, 2007

(65) Prior Publication Data

US 2008/0194090 A1    Aug. 14, 2008

(30) Foreign Application Priority Data

Feb. 8, 2007    (KR) ...................... 10-2007-0013285

(51) Int. Cl.
*H01L 21/31* (2006.01)
(52) U.S. Cl. .............. 438/775; 257/E21.267; 438/259; 438/270
(58) Field of Classification Search ................ 438/259, 438/270, 485, 775, 769–772; 257/E27.091, 257/E21.267, E21.302
See application file for complete search history.

(56) References Cited

U.S. PATENT DOCUMENTS

| 6,368,988 | B1 * | 4/2002 | Li et al. ...................... 438/792 |
| 2005/0212035 | A1 * | 9/2005 | Utsuno et al. ................ 257/315 |
| 2008/0246099 | A1 * | 10/2008 | Varghese et al. ............ 257/410 |

FOREIGN PATENT DOCUMENTS

| KR | 1020000056496 | 9/2000 |
| KR | 1020050062140 | 6/2005 |

* cited by examiner

*Primary Examiner*—David Vu
(74) *Attorney, Agent, or Firm*—Ladas & Parry LLP

(57) ABSTRACT

A method for manufacturing a semiconductor device for use in avoiding unwanted oxidation along exposed surfaces and for use in relieving etching damage is presented. The method includes step of forming sequentially a gate insulation layer, a polysilicon layer, a barrier layer, a metallic layer and a hard mask layer over a semiconductor substrate. The method also includes a step of etching the hard mask layer, the metallic layer, the barrier layer, the polysilicon layer and the gate insulation layer to form a gate. The method also includes a nitrifying step which uses a free radical is assisted chemical vapor deposition (RACVD) nitrifying process on surfaces of the layers forming the gate and a surface of the semiconductor substrate. The method also includes a step of subsequently performing a reoxidation process to the semiconductor substrate resultant that the RACVD nitrifying process is performed.

8 Claims, 4 Drawing Sheets

METHOD FOR MANUFACTURING SEMICONDUCTOR DEVICE USING A FREE RADICAL ASSISTED CHEMICAL VAPOR DEPOSITION NITRIFYING PROCESS

CROSS-REFERENCE TO RELATED APPLICATIONS

The present application claims priority to Korean patent application number 10-2007-0013285 filed on Feb. 8, 2007, which is incorporated herein by reference in its entirety.

BACKGROUND OF THE INVENTION

The present invention relates to a method for manufacturing a semiconductor device, and more particularly, to a method for manufacturing a semiconductor device which is capable of improving a complexity of an etching process for forming a gate and preventing undesirable oxidation of a metal layer forming the gate.

In order to solve the problem of resistance generated as an effective area of a gate is decreased with high integration of a semiconductor device, tungsten (W) with superior thermal stability and filling characteristic is used as a gate material. However, when the tungsten is used as the gate material, an undesirable oxidation occurs in an exposed portion of the tungsten during the gate forming process. Accordingly, there has been suggested a method of forming a capping nitride layer on a side wall of the gate for preventing the undesirable oxidation from occurring in the exposed portion of the tungsten.

However, the conventional gate forming process including the process of forming the capping nitride layer for preventing the undesirable oxidation from occurring in the exposed portion of the tungsten is complex in an aspect of a process and may cause an undesirable problem due to localized generation of heat.

Specifically, the conventional method for manufacturing a semiconductor device including the formation of the capping nitride layer will be described with reference to FIGS. 1A through 1D.

Referring to FIG. 1A, a gate insulation layer 104 is formed over a semiconductor substrate 100 formed with an isolation layer 102 for defining an active region and a groove H for forming a recess gate and a polysilicon layer 106 is formed over the gate insulation layer 104 to fill the groove H. Over the polysilicon layer 106, a barrier layer 108, a tungsten layer 110, a hard mask layer 112, an amorphous carbon layer 114, an arc layer 116, and a mask pattern 118 made of photoresist and exposing an area for a gate to be formed are sequentially formed.

Referring to FIG. 1B, the arc layer (not shown), the amorphous layer (not shown) and the hard mask layer 112 are etched using the mask pattern (not shown) as an etching mask and then the mask pattern, the arc layer and the amorphous layer are removed. Then, the tungsten layer 110, the barrier layer 108 and some thickness of a surface of the polysilicon layer 106 are etched using the etched hard mask layer 112 as an etching mask.

Referring to FIG. 1C, a capping nitride layer 120 is formed over the etched polysilicon layer 106, barrier layer 108, tungsten layer 110 and hard mask layer 112.

Referring to FIG. 1D, the capping nitride layer 120, the polysilicon layer 106 some thickness of which is etched and the gate insulation layer 104 is etched to complete the formation of the gate.

As described above, the conventional gate forming method includes a first etching process in which the tungsten layer 110, the barrier layer 108 and some thickness of the polysilicon layer 106 are etched and a second etching process in which the capping nitride layer 120 and the rest portion of the firstly etched polysilicon layer 106 are etched. Therefore, the conventional gate forming process including the process of forming the capping nitride layer 120 is complex in an aspect of the process and is also hard to realize the process.

Further, heat of more than 700° C. is applied to a semiconductor substrate during the process of forming the capping nitride layer 120 and a gate leaning occurs consequently due to a difference of thermal expansion coefficient between various layers forming the gate.

In addition, since even the thickness of the capping nitride layer is also included in the critical dimension (CD) of the gate, a CD of the tungsten layer 110 is therefore decreased which leads to increase in a resistance of the gate.

SUMMARY OF THE INVENTION

Embodiments of the present invention are directed to a method for manufacturing a semiconductor device which is capable of improving the quality of the resultant product made from an etching process for forming a gate.

Also, embodiments of the present invention are directed to a method for manufacturing a semiconductor device which is capable of undesirable oxidation of a metal layer forming the gate.

In one embodiment, a method for manufacturing a semiconductor device comprises the steps of forming sequentially a gate insulation layer, a polysilicon layer, a barrier layer, a metallic layer and a hard mask layer over a semiconductor substrate; etching the hard mask layer, the metallic layer, the barrier layer, the polysilicon layer and the gate insulation layer to form a gate; nitrifying surfaces of the layers forming the gate and a surface of the semiconductor substrate in a nitrifying process; and performing a reoxidation process to the semiconductor substrate resultant that the RACVD nitrifying process is performed.

The metallic layer includes a tungsten layer.

The nitrifying process is performed using $NH_3$ gas as a reactant gas under a temperature of 550~650° C. and a pressure of 0.5~5 Torr according to a radical assisted chemical vapor deposition (RACVD) process.

The reoxidation process is performed using $H_2$ and $O_2$ gases as a reactant gas under a temperature of 550~650° C. and a pressure of 0.5~5 Torr according to a RACVD process.

The nitrifying process and the reoxidation process are performed in situ.

The method may further comprise, before the formation of the gate insulation layer, the step of forming a groove in the semiconductor substrate.

DESCRIPTION OF SPECIFIC EMBODIMENTS

In the present invention, layers forming a gate are etched at once, and exposed surface of the layers forming the gate and a surface of a semiconductor substrate are nitrified with free radical, i.e., N*, using a radical assisted (RA) method of a radical assisted chemical vapor deposition (RACVD) process and then reoxidized in situ.

In this case, it is possible to improve the quality of the resultant product made from an etching process for forming a gate since the layers forming a gate are etched at once, and it is also possible to realize selective oxidation process in which an etching damage on a surface of a semiconductor substrate is relieved and undesirable oxidation does not occur on a surface of a metal layer since exposed surface of the layers forming the gate and a surface of a semiconductor substrate are nitrified with radical N* before the reoxidation is performed.

The RACVD process is a method in which radicals of a reactant gas generated by a plasma and source gases are injected into a chamber in a vacuum state through a shower head installed at an upper part of the chamber to deposit a layer and this RACVD process provides a number of advantages in that plasma damage is substantially reduced since a low power of 100~1,000 W is used in the process, a radical reactant gas with strong reactivity is still used and a low temperature of 350~650° C. can be applied.

Therefore, in the present invention, it is possible to realize a more rapid reaction time since a semiconductor device is manufactured using the RA method of the RACVD process, and it is also possible to minimize thermal influence and thus substantially prevents gate leaning since the process can be performed in a low temperature.

Hereafter, a preferred embodiment of the present invention will be described in detail with reference to the accompanying drawings.

FIGS. 2A through 2D are cross-sectional views illustrating the steps of a method for manufacturing a semiconductor device in accordance with an embodiment of the present invention.

Figure 1A:
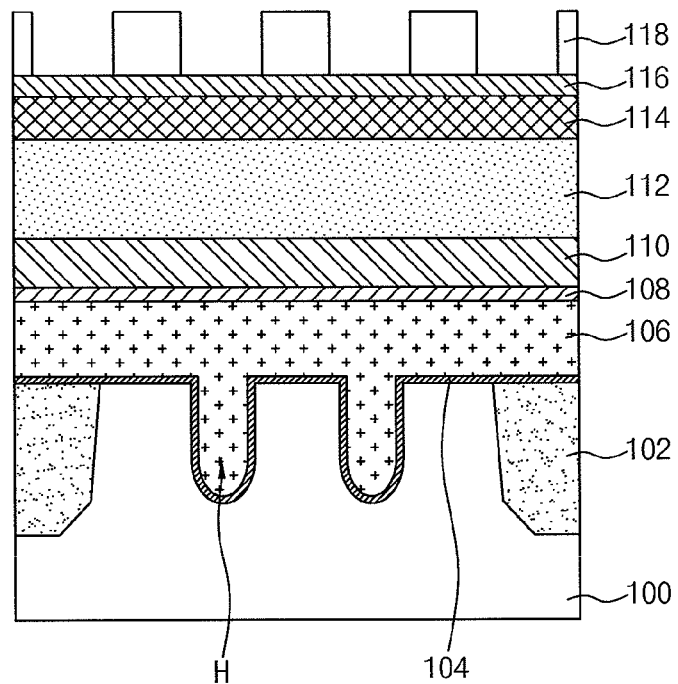
FIGS. 1A through 1D are cross-sectional views illustrating the steps of a conventional method for manufacturing a semiconductor device.
Figure 1B:
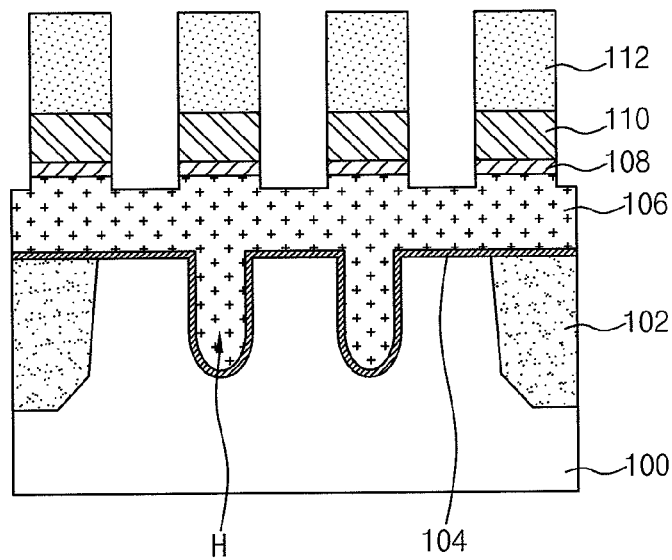
Figure 1C:
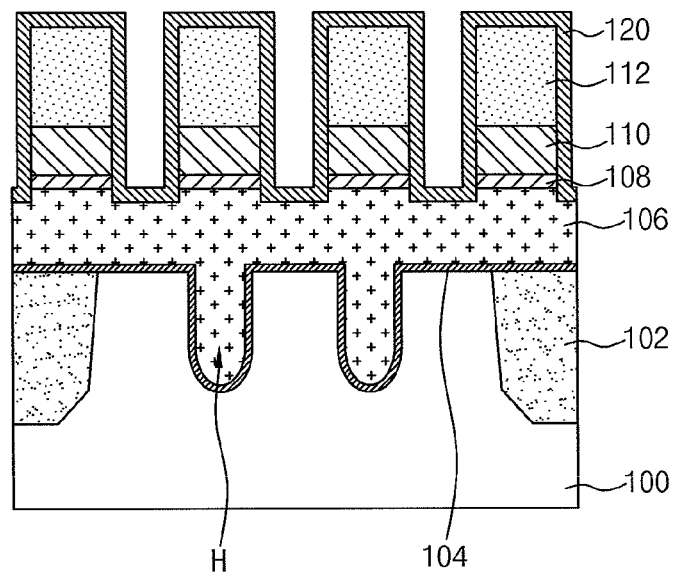
Figure 1D:
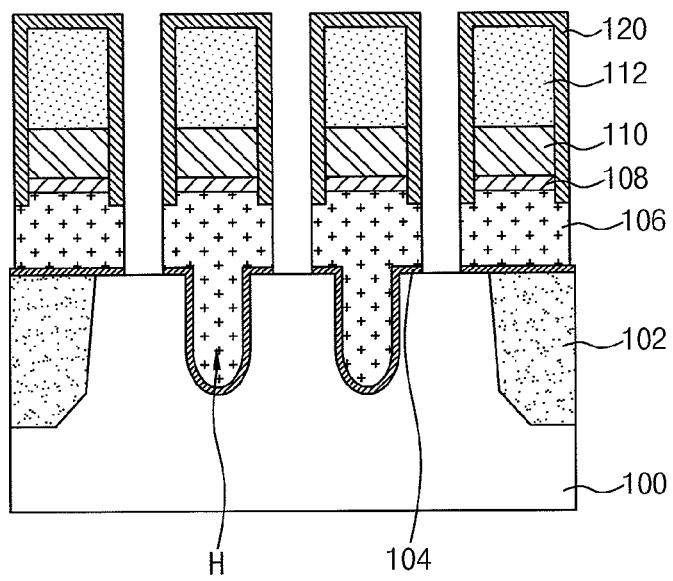
Figure 2A:
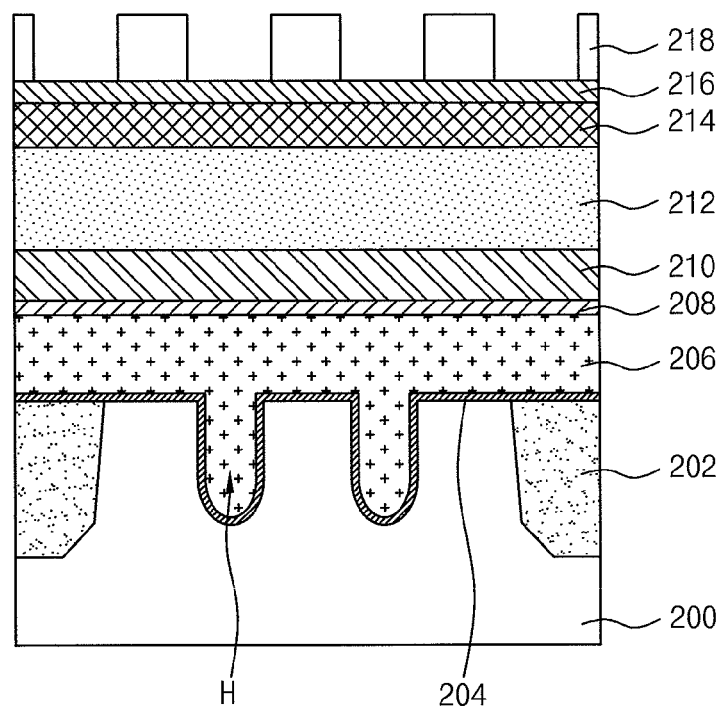
FIGS. 2A through 2D are cross-sectional views illustrating the steps of a method for manufacturing a semiconductor device in accordance with an embodiment of the present invention.

Referring to FIG. 2A, a groove H for forming a recess gate 220 is formed in a semiconductor substrate 200 formed with an isolation layer 202 for defining an active region. A gate insulation layer 204 is formed over the semiconductor substrate 200 including a surface of the groove H. A polysilicon layer 206 is formed over the gate insulation layer 204 to fill the groove H and then a surface of the polysilicon layer 206 is planarized. A barrier layer 208, a metallic layer 210 made of tungsten, a hard mask layer 212, an amorphous carbon layer 214, an arc layer 216 and a mask pattern 218 made of photoresist and exposing an area for a gate to be formed are sequentially formed over the planarized polysilicon layer 206.

Figure 2B:
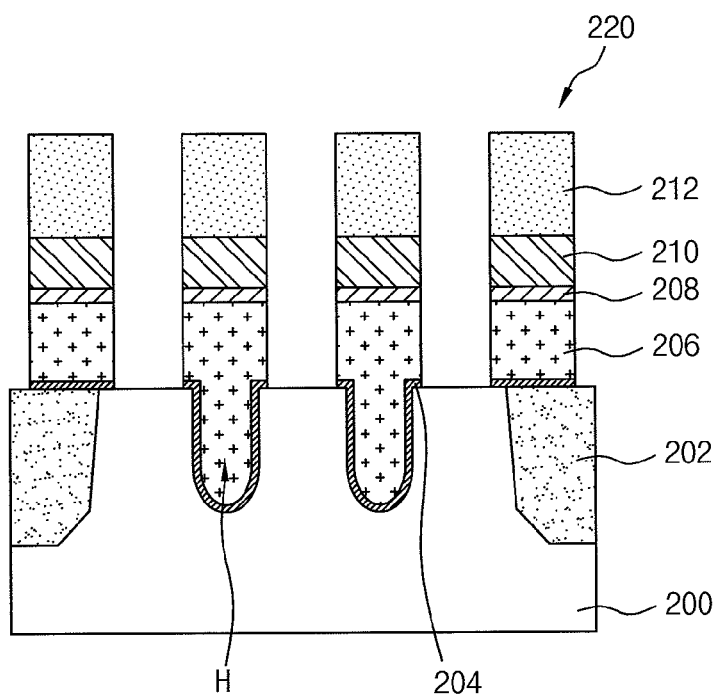

Referring to FIG. 2B, the arc layer 216, the amorphous carbon layer 214 and the hard mask layer 212 are etched using the mask pattern as an etching mask and then the mask pattern, the arc layer and the amorphous carbon layer 214 are removed. The metallic layer 210, the barrier layer 208, the polysilicon layer 206 and the gate insulation layer 204 are continuously etched using the etched hard mask layer 212 as an etching mask.

Figure 2C:
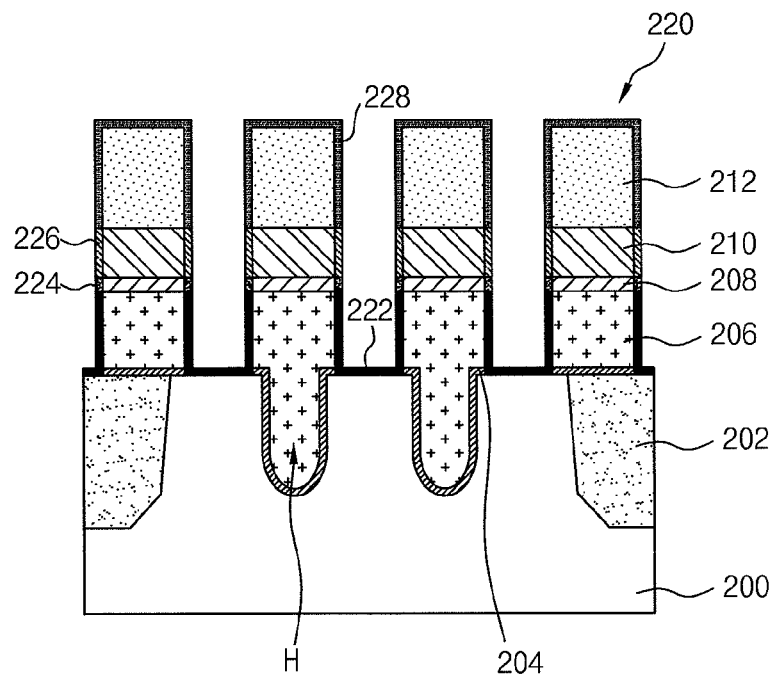

Referring to FIG. 2C, a nitrifying process is performed to nitrify surfaces of the layers 204, 206, 208, 210 and 212 forming the gate 220. The nitrifying process is performed such that free radicals, i.e., N*, are generated using $NH_3^+$ as a reactant gas which react at the surface of the semiconductor substrate 200 under a temperature of 550~650° C. and a pressure of 0.5~5 Torr according to RACVD process. As the result of the RACVD process, a silicon oxynitride (SiON) layer 222 is formed over the exposed surfaces of the polysilicon layer 206, the gate insulation layer 204 and the semiconductor substrate 200; a barrier nitride layer 224 is formed over the exposed surface of the barrier layer 208; a metal nitride layer 226 such as a tungsten nitride layer is formed over the exposed surface of the metallic layer 210 made of tungsten; and a hard mask nitride layer 228 is formed over the exposed surface of the hard mask layer 212.

Herein, since the nitride layers 222, 224, 226, 228 are formed over the exposed surfaces of the layers 204, 206, 208, 210 and 212 forming the gate 220, occurrence of the undesirable oxidation in the surfaces of the layers 204, 206, 208, 210 and 212, particularly the metallic layer 210 is prevented during the following reoxidation process and a damaged portion of the barrier layer 208 generated during the gate 220 is etched is compensated by the barrier nitride layer 222 formed over the exposed surface of the barrier layer 208.

Figure 2D:
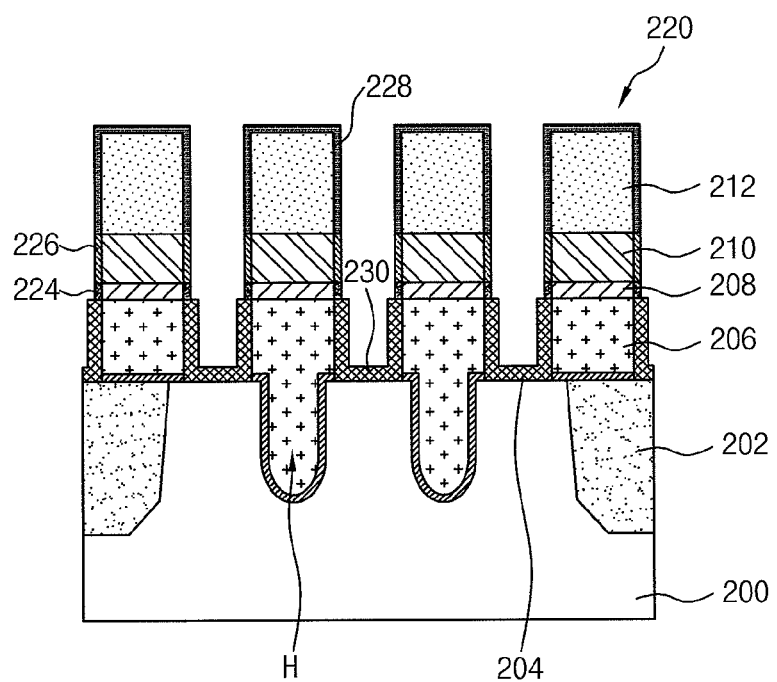

Referring to FIG. 2D, the reoxidation process is subsequently performed to the gate 220 of which the exposed surfaces of the layers 204, 206, 208, 210 and 212 were nitrified by the flow of the free radicals, i.e., N*, and, through this reoxidation process, the silicon oxynitride layer formed over the exposed surfaces of the polysilicon layer 206, the gate insulation layer 204 and the semiconductor substrate 200 to form a reoxidation layer 230. The reoxidation process is performed in situ to the resultant substrate to which the nitrifying process was performed, and is performed in the RA method using hydrogen ($H_2$) and oxygen ($O_2$) gases as the reactant gas under a temperature of 550~650° C. and a pressure of 0.5~5 Torr according to RACVD process.

Herein, the etching damage generated when the layers forming the gate 220 are etched is relieved by the reoxidation process, and a deformation of the gate insulation layer 204 formed at a lower portion of a side wall of the gate 220 is also cured and thus a gate bird's beak portion is reinforced. Therefore, a gate insulation layer having substantially little or no interfacial defects provides a resultant electrically property superior in quality is obtained, thereby capable of enhancing the reliability of the resultant device.

As is apparent from the above description, in the present invention, the surface of the gate 220 is nitrified in a low temperature using RACVD process and then subsequently reoxidized in situ. Therefore, it is possible to realize a selective oxidation process without the occurrence of the undesirable oxidation in the metallic layer during the reoxidation process.

Accordingly, in the present invention, since the gate is formed by etching the layers forming the gate at once without formation of a capping nitride layer, it is possible to the complexity of the gate etching process and thus realize a stable process.

Also, in the present invention, it is possible to realize a selective oxidation process through the reoxidation process using the RA oxidation process as well as to improve a layer quality of the gate insulation layer, thereby capable of enhancing reliability of a device.

In addition, in the present invention, since a semiconductor device is manufactured using RACVD process, it is possible to realize a quick reaction time and allow the process to be performed in a low temperature. Therefore, it is possible to minimize the thermal influence and thus prevent generation of the gate leaning.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming sequentially a gate insulation layer, a polysilicon layer, a barrier layer, a metallic layer and a hard mask layer over a semiconductor substrate;
    etching the hard mask layer, the metallic layer, the barrier layer, the polysilicon layer and the gate insulation layer to form a gate;
    nitrifying, using a free radical assisted chemical vapor deposition (RACVD) nitrifying process, exposed surfaces of the layers forming the gate and the semiconductor substrate; and
    performing a reoxidation process to the semiconductor substrate resultant that the RACVD nitrifying process is performed.

2. The method according to claim 1, wherein the metallic layer comprises tungsten.

3. The method according to claim 1, wherein the nitrifying process is performed under a temperature of 550~650° C. and a pressure of 0.5~5 Torr according to a radical assisted chemical vapor deposition (RACVD) process.

4. The method according to claim 1, wherein the nitrifying process is performed using $NH_3$ gas as a reactant gas.

5. The method according to claim 1, wherein the reoxidation process is performed under a temperature of 550~650° C. and a pressure of 0.5~5 Torr according to a RACVD process.

6. The method according to claim 1, wherein the reoxidation process is performed using $H_2$ and $O_2$ gases as a reactant gas.

7. The method according to claim 1, wherein the nitrifying process and the reoxidation process are performed in situ.

8. The method according to claim 1, further comprising forming a groove in the semiconductor substrate before the forming the gate insulation layer.

* * * * *